US007387835B2

(12) United States Patent
Fujita

(10) Patent No.: US 7,387,835 B2

(45) Date of Patent: Jun. 17, 2008

(54) SILICON CARBIDE-COATED CARBONACEOUS MATERIAL AND CARBONACEOUS MATERIAL TO BE COATED WITH SILICON CARBIDE

(75) Inventor: Ichiro Fujita, Mitoyo-gun (JP)

(73) Assignee: Toyo Tanso Co., Ltd., Osaka (JP)

( * ) Notice: Subject to any disclaimer, the term of this patent is extended or adjusted under 35 U.S.C. 154(b) by 116 days.

(21) Appl. No.: 10/969,001

(22) Filed: Oct. 21, 2004

(65) Prior Publication Data

US 2005/0106423 A1 May 19, 2005

(30) Foreign Application Priority Data

Oct. 28, 2003 (JP) ............................ 2003-366928

(51) Int. Cl.
*B32B 9/00* (2006.01)

(52) U.S. Cl. ......................... 428/408; 428/698; 432/258

(58) Field of Classification Search ................. 428/408; 423/445 R, 447, 447.2, 448, 449, 461
See application file for complete search history.

(56) References Cited

U.S. PATENT DOCUMENTS

| | | | | |
|---|---|---|---|---|
| 5,505,929 | A * | 4/1996 | Matsumoto et al. | 423/448 |
| 5,989,504 | A * | 11/1999 | Wilson et al. | 423/23 |
| 6,030,595 | A | 2/2000 | Sumiya et al. | |
| 2005/0079359 | A1 | 4/2005 | Fujita et al. | |

FOREIGN PATENT DOCUMENTS

| | | | |
|---|---|---|---|
| EP | 1 375 423 A1 | | 1/2004 |
| JP | 03-177371 A | | 8/1991 |
| JP | 10-167885 | | 6/1998 |
| JP | 11-157989 | | 6/1999 |
| JP | 11-310459 | | 11/1999 |
| JP | 2000-219584 | | 8/2000 |
| JP | 2000-247757 | | 9/2000 |
| JP | 2000-351670 | | 12/2000 |
| JP | 2002-249376 | * | 9/2002 |
| JP | 2003-086518 | | 3/2003 |
| JP | 2004-065823 | | 3/2004 |
| JP | 2005-132711 | | 5/2005 |

OTHER PUBLICATIONS

Spencer et al, IEEE Transactions on Electron Devices, 2002, vol. 49, No. 5, pp. 940-945.
Pschenichnyuk et al, Technical Physics, 2001, vol. 46, No. 10, pp. 1303-1306.
Pivovarov et al, J. Vac. Sci. Technol. A, 2003, vol. 21, No. 5, pp. 1649-1654.
M. A. Avdeenko, et al., “Cleaning graphite crucibles used in semi-conductor technology—by heating in an inert gas, inert gas/halogen mixture and cooling in separate compartment under vacuum”, XP-002221498, SU 394303, Dec. 28, 1973.
Basic and Application of SIC Element, pp. 62-66 (2003) (with partial English translation).

* cited by examiner

*Primary Examiner*—Jennifer McNeil
*Assistant Examiner*—Timothy M. Speer
(74) *Attorney, Agent, or Firm*—Oblon, Spivak, McClelland, Maier & Neustadt, P.C.

(57) ABSTRACT

The invention provides a SiC coated carbonaceous material and a carbonaceous material to be coated with SiC each of which is reduced in contents of such impurities as nitrogen and boron. The SiC coated carbonaceous material comprises a carbonaceous material and a SiC coating having a nitrogen content of $5\times10^{16}$ atoms/cm$^3$ or lower as measured by SIMS. Further, the SiC-coated carbonaceous material comprises a carbonaceous material and a SiC coating having a boron content of $2\times10^{16}$ atoms/cm$^3$ or lower as measured by SIMS. The carbonaceous substrate material preferably has nitrogen content of $5\times10^{18}$ atoms/cm$^3$ or lower as measured by SIMS. The base carbonaceous material also preferably has boron content of $1\times10^{16}$ atoms/cm$^3$ or lower as measured by SIMS.

10 Claims, No Drawings

SILICON CARBIDE-COATED CARBONACEOUS MATERIAL AND CARBONACEOUS MATERIAL TO BE COATED WITH SILICON CARBIDE

FIELD OF THE INVENTION

This invention relates to a carbonaceous material coated with a high-purity silicon carbide (hereinafter referred to "SiC") material and, more particularly, to a high-purity SiC-coated carbonaceous material reduced in nitrogen and/or boron concentration and suited for use as tools in semiconductor production, in particular silicon semiconductor production, as tools in SiC semiconductor production, and as tools in gallium nitride (hereinafter referred to as "GaN") semiconductor production.

BACKGROUND OF THE INVENTION

In recent years, researches and developments have been actively made in the field of materials comprising SiC as furnace inside parts in the production of silicon semiconductors or gallium nitride semiconductors and in the field of semiconductors comprising SiC as wide gap semiconductors. Owing to their high frequency, breakdown voltage, saturation drift velocity and thermal conductivity characteristics, SiC semiconductors have attracted attention as high efficiency and high voltage withstanding power devices and high-frequency devices, which are operable at high temperatures. SiC-coated carbonaceous materials, namely carbonaceous materials surface-coated with SiC, are used in fabricating SiC wafers, epitaxial grown layers, and devices which are necessary for the production of such SiC semiconductors.

So far, SiC-coated graphite materials have been used widely as tools or jigs used in the field of semiconductor production. Although attention has been paid to impurity concentrations as well, the scope of attention has been restricted to reduction in concentrations of heavy metals, in particular iron (cf Laid-open Japanese Patent Application (JP Kokai) No. 2002-128579 and JP Kokai 2002-128580).

Meanwhile, graphite materials generally contain metal impurities entrapped in pores and between lattice layers thereof, hence they as such cannot be used. Therefore, the Applicants have previously proposed, for use in the semiconductor and nuclear industries, high-purity graphite materials having a metal impurity (ash) contents of 5 ppm or less as a result of treatment of graphite materials with halogen-containing gases, for instance, for attaining high levels of purity (JP Kokai No. S64 (1989)-18986; Japanese Patent Publication (JP Kokoku) No. H06 (1994)-35325). They have also recently proposed, in JP Kokai 2002-249376, carbonaceous materials reduced in nitrogen content for use in the manufacture of compound semiconductors.

However, analysis by secondary ion mass spectrometry (hereinafter, "SIMS") have revealed that even such SiC coated graphite materials still contain $1\times10^{17}$ atoms/cm$^3$ or higher of nitrogen and $4\times10^{16}$ atoms/cm$^3$ or higher of boron. It has also been revealed that this nitrogen penetrates into SiC on the occasion of producing epitaxial SiC layers and SiC devices and thereby increases the nitrogen concentration in SiC single crystals or SiC wafers and thus markedly deteriorates the semiconductor characteristics.

Furthermore, whereas the epitaxial growth of SiC is generally carried out at high temperatures of 1500° C. or higher, the SiC of the SiC coated graphite material used as tools is sublimated and the nitrogen and/or boron contained in the SiC coating is emitted. The nitrogen emitted from the SiC coated graphite material contaminates the epitaxial layer, so that the nitrogen content in the SiC epitaxial layer is $3\times10^{15}$ atoms/cm$^3$ or higher. This nitrogen increases the defect density of the epitaxial layer and at the same time functions as a dopant to the SiC semiconductor and deteriorates the device characteristics.

Graphite materials and SiC coated graphite materials are also utilized as tools or jigs in the production of silicon semiconductors and gallium nitride (GaN) semiconductors. It is known that, in the production of these semiconductors, contamination with boron, in particular, results in marked deterioration in semiconductor characteristics.

Further, nitrogen and/or boron contained in the SiC layer of the SiC coated graphite materials used as tools causes deterioration in semiconductor characteristics.

SUMMARY OF THE INVENTION

To solve the problems discussed above, the present inventors made investigations concerning the changes in nitrogen and boron concentrations as functions of the manufacturing conditions for SiC coated carbonaceous materials and, as a result, it was found that the nitrogen concentration in the SiC coating markedly varies depending on the impurity concentration in the production atmosphere and in the raw materials including the carbonaceous material. As a result of further investigations made based on the above finding of means for producing SiC coated carbonaceous materials further reduced in nitrogen concentration, the present invention has now been completed.

Thus, in an aspect, the invention provides a SiC coated carbonaceous material, which comprises a carbonaceous material and a SiC coating covering the carbonaceous material, having a nitrogen content in the SiC coating of $5\times10^{16}$ atoms/cm$^3$ or less as measured by SIMS. The nitrogen content in the SiC layer is preferably $1\times10^{16}$ atoms/cm$^3$ or less, more preferably $5\times10^{15}$ atoms/cm$^3$ or less, as measured by SIMS. The above-mentioned carbonaceous material, namely the substrate material, preferably has a nitrogen content of $5\times10^{18}$ atoms/cm$^3$ or less, more preferably $5\times10^{17}$ atoms/cm$^3$ or less, most preferably $5\times10^{16}$ atoms/cm$^3$ or less, as measured by SIMS. Further, the carbonaceous substrate material preferably has a boron content of $1\times10^{16}$ atoms/cm$^3$ or less, more preferably $5\times10^{15}$ atoms/cm$^3$ or less, as measured by SIMS. Further, the base carbonaceous substrate material preferably has a nitrogen content of $5\times10^{18}$ atoms/cm$^3$ or less as measured by SIMS and a boron content of $1\times10^{16}$ atoms/cm$^3$ or less as measured by SIMS.

In accordance with the above aspect of the invention, it is possible to suppress the nitrogen and boron contents in the SiC coat layer and SiC coated carbonaceous material and, therefore, when such material is used as tools or jigs for the production of epitaxial layers of SiC semiconductors, it becomes possible to markedly inhibit control the contamination of epitaxial layers with nitrogen.

In another aspect, the invention provides a SiC coated carbonaceous material, which comprises a carbonaceous material and a SiC coated carbonaceous material, having a boron content in the SiC layer of not higher than $2\times10^{16}$ atoms/cm$^3$. The boron content in the SiC layer is preferably $5\times10^{15}$ atoms/cm$^3$ or less, more preferably $1\times10^{15}$ atoms/cm$^3$ or less, as measured by SIMS. The above-mentioned carbonaceous material, namely the substrate material, preferably has a nitrogen content of $5\times10^{18}$ atoms/cm$^3$ or less, more preferably $5\times10^{17}$ atoms/cm$^3$ or less, most preferably $5\times10^{16}$ atoms/cm$^3$ or less, as measured by SIMS. Further, the base carbonaceous substrate material preferably has a boron content of $1\times10^{16}$ atoms/$cm^3$ or less, more preferably $5\times10^{15}$ atoms/$cm^3$ or less, as measured by SIMS. Thus, the carbonaceous substrate material preferably has a nitrogen content of $5\times10^{18}$ atoms/$cm^3$ or less as measured by SIMS and a boron content of $1\times10^{16}$ atoms/$cm^3$ or less as measured by SIMS.

In accordance with the second aspect of the invention, it is possible to suppress the nitrogen and boron contents in the SiC coating layer and SiC coated carbonaceous material and, therefore, when such material is used, for example, as tools or jigs for the production of single crystals for silicon semiconductors or compound semiconductors (e.g. SiC or GaN) or for the production of epitaxial layers, it becomes possible to markedly inhibit the contamination of semiconductor products with boron.

DETAILED DESCRIPTION OF THE INVENTION

First, the carbonaceous material to be used in the practice of the invention is described.

The carbonaceous material to be used in the practice of the invention includes not only those generally defined as graphite materials but also carbon fiber based composite materials, glassy carbon materials and exfoliated graphite sheets, among others. These carbonaceous materials are subjected to high purity attaining treatment for use as carbonaceous materials to be coated with SiC in the practice of the invention. For example, calcined carbon material is prepared by mixing one or more of finely pulverized natural graphite, artificial graphite, petroleum coke, coal coke, pitch coke, carbon black and mesocarbon, with a binder such as pitch, coal tar, coal tar pitch or thermosetting resin, followed by kneading, grinding, molding and baking or, if necessary, graphitized carbonaceous material is derived therefrom by further graphitization.

Processes for highly purifying the above carbonaceous material and process for coating the high-purity carbonaceous material reduced in nitrogen and/or boron content with SiC are now described.

The above-mentioned carbonaceous material can be highly purified, for example by the process described below.

Thus, for attaining high levels of purity, the material is treated in gaseous atmosphere comprising halogen or compound thereof, for example chlorine, trichloromethane, dichloromethane, monochloromethane, fluorine, tetrafluoromethane, trifluoromethane, difluoromethane, monofluoromethane, monochlorotrifluoromethane, dichlorofluoromethane, trichlorofluoromethane, tetrafluoroethane, monochloroethane, monochlorofluoroethane, monochlorodifluoroethane, monochlorotrifluoroethane, dichloroethane, dichloromonofluoroethane, dichlorodifluoroethane, dichlorotrifluoroethane, trichloroethane, trichloromonofluoroethane, trichlorodifluoroethane or tetrachloroethane, at the temperature of 2400° C. or higher (preferably not lower than 2450° C.) to thereby eliminate such impurity metals as boron (B) and vanadium (V) in the main (high purification process).

Thereafter, further purification process is performed by treatment in gaseous atmosphere comprising halogen or compound thereof under reduced pressure, namely at the pressure between 0.2 Pa and 0.1 MPa (preferably between 0.5 Pa and 0.05 MPa), and at a temperature of 2000° C. or higher (preferably 2050° C. to 2400° C.) to thereby eliminate those metals which are capable of forming volatile halides (ultrahigh purification process).

Further, the carbonaceous material subjected to these high purification processes is heated between 1400° C. and 1600° C., preferably between 1450° C. and 1550° C., in the vacuum furnace at reduced pressure of 100 Pa or lower (preferably 50 Pa or lower) for a period of 5 hours or longer (preferably 10 hours or longer) to thereby eliminate volatile impurities such as nitrogen and oxygen (degassing (nitrogen elimination) process).

Finally, following the degassing (nitrogen elimination) process, hydrogen is introduced into the vacuum furnace heated between 1400° C. and 1600° C. (preferably between 1450° C. and 1550° C.) to hydrogen pressure from 100 Pa to 1000 Pa to thereby eliminate those impurities capable of readily forming volatile hydrides and at the same time to hydrogenate the surface of the carbonaceous material so that such impurities as nitrogen (N), oxygen (0), phosphorus (P) and sulfur (S) can hardly adsorb to the treated material surface, namely the carbonaceous material, upon release thereof to the atmosphere (hydrogenation process).

The carbonaceous material highly purified by the process comprising the above processes is then surface coated with SiC layers formed by the CVD (chemical vapor deposition) method or by the sputtering or like PVD (physical vapor deposition) method. In the case of SiC coating produced by the CVD method, the carbonaceous material is placed, as a substrate, in a CVD reaction apparatus, such as an ordinary pressure thermal CVD reaction apparatus or reduced pressure thermal CVD apparatus, the system inside is evacuated and heated to a predetermined appropriate temperature and, while maintaining the temperature, hydrogen gas is fed to the system to give hydrogen atmosphere and, then, process gases comprising organosilicon halide compounds, such as $CH_3SiCl_3$, $(CH_3)_2SiCl_2$ or $CH_3SiHCl_2$, or silicon compounds, such as $SiCl_4$, and carbon compounds, such as $CH_4$, is fed to the system using hydrogen gas as a carrier gas to allow the gaseous phase thermal decomposition reaction to proceed for deposition of SiC on the carbonaceous material surface and coating that surface with a SiC layer. The carrier gas and raw material component gases each preferably has a purity of 99.99% or higher, more preferably 99.999% or higher, still more preferably 99.9999% or higher.

While carbonaceous materials such as graphite, carbon fibers and exfoliated graphite sheets or materials derived from such carbonaceous materials with SiC coating are used as furnace inside tools or jigs in the furnace in which SiC coating is carried out, it is necessary to suppress the concentration of impurities contained in those tools or jigs to a low level. Therefore, the carbonaceous materials and furnace jigs to be used are all subjected to purification treatment for impurity concentration reductions. Before coating SiC, the furnace jigs including graphite substrates are sufficiently degassed.

The constitution mentioned above makes it possible to suppress the nitrogen and boron contents in the SiC coatings and SiC coated carbonaceous materials and suppress the impurity concentrations in the carbonaceous materials as substrates for coating with SiC. Therefore, when the SiC coatings and SiC coated carbonaceous materials according to the present invention are used as tools or jigs for the production of epitaxial layers of SiC semiconductors, it is possible to markedly inhibit the contamination of epitaxial layers with boron or nitrogen.

Further, when the SiC coatings and carbonaceous materials according to the present invention are used, for example, as tools or jigs for the production of compound semiconductor single crystals, such as SiC or GaN, or for the production of epitaxial layers, it becomes possible to inhibit the semiconductor products from contamination of nitrogen and boron.

Several examples and comparative examples are shown as follows.

First, the analytical method SIMS used for the measurement of impurity concentrations in the samples of the examples and comparative examples is described.

SIMS is a method of analysis which measures mass of sputtered particles from the material surface with primary ions (generally $O_2^+$, $Cs^+$ or $Ga^+$ ions) accelerated to several hundreds volts to 20 keV. The SIMS apparatus used in the following examples and comparative example was CAMECA's IMS-3f·4f·4.5f. Different primary ion species were used according to the elements to be measured. Thus, $O_2^+$ ions were used as primary ions for boron, and $Cs^+$ ions were used for nitrogen. After etching to a depth from 5 to 10 μm using such primary ions, the value at the time when the concentration of an element became constant was taken as the concentration of that element.

The test specimens used in the measurements in the examples and comparative examples, which were 7 mm×7 mm×2 mm in size, were prepared in advance from an isotropic graphite material and from SiC coated materials derived therefrom by allowing a SiC coating to deposit on the surface to a thickness from 80 to 100 μm.

EXAMPLE 1

First, a graphite material to serve as the substrate material of the SiC coated carbonaceous material of the invention was prepared by using an atmospheric pressure graphitization furnace.

The heating members in the atmospheric pressure graphitization furnace were heated by gradual voltage application and, while heating a graphitized isotropic carbon material produced by Toyo Tanso Co., Ltd. at 2450° C. and at 1 atm. ($1.01325\times10^5$ Pa), halogen gases or halogen compound gases, for example dichlorodifluoromethane, was fed to the furnace for about 8 hours (at a flow rate of about from 1 to 7 NLM/kg, for instance, although the flow rate may be varied according to the amount of carbonaceous material placed and heated in the vessel) (high purification process).

Then, the furnace inside pressure was reduced. The furnace inside was maintained at 2250° C., halogen gases or halogen compound gases, for example dichlorodifluoromethane, was fed again into the furnace. This treatment was carried out for 5 hours while maintaining the furnace pressure at 1000 Pa (ultrahigh purification process). Thereafter, the material was cooled to 1450° C. while maintaining the furnace pressure at 10 Pa, and then maintained at 1450° C. for 48 hours (degassing (nitrogen elimination) process). After the nitrogen gas elimination process, the material was maintained at 100 Pa of the vessel inside pressure for 1 hour while introducing hydrogen (purity: 99.99999% or higher) into the furnace (hydrogenation process).

Then, hydrogen gas was introduced into the furnace (300 liters in capacity) to atmospheric pressure and the temperature was maintained at 1300° C. $CH_3SiCl_3$ was used as a process gas and hydrogen as a carrier gas, a mixed gas composed thereof ($CH_3SiCl_3$ concentration: $CH_3SiCl_3/H_2$=10.0 vol %) was introduced into the furnace at a flow rate of 15 SLM at 1300° C. for 2 hours to coat the substrate graphite material with SiC (SiC coating process). The hydrogen used had a purity of 99.9999% or higher, and the $CH_3SiCl_3$ had a purity of 99.999% or higher. On that occasion, the furnace jigs and members used were all SiC coated ones as prepared beforehand in the same manner as the materials subjected to the above ultrahigh purification, degassing (nitrogen elimination) and hydrogenation processes. Then, argon gas (purity: 99.9999% or higher) was introduced, as a rare gas, into the furnace, and the furnace was cooled to room temperature. After cooling to room temperature, the material, together with argon gas, was sealed in a polyethylene film bag and stored so that it might not be exposed to the atmosphere.

Thus, the obtained material was used as the sample of Example 1.

EXAMPLE 2

The same graphite material as used in Example 1 was subjected to the same ultrahigh purification process, without carrying out the high purification process, under the same conditions as in Example 1 and then sealed in a polyethylene film bag, together with argon gas, and stored so that it might not be exposed to the atmosphere. This graphite material was again placed in the furnace and heated again to 1450° C. and subjected to the degassing (nitrogen elimination), hydrogenation and SiC coating processes in the same manner as in Example 1. Argon gas, as a rare gas, was introduced into the furnace, followed by cooling to room temperature. After cooling to room temperature, the material, together with argon gas, was sealed in a polyethylene film bag and stored so that it might not be exposed to the atmosphere.

Thus, the obtained material was used as the sample of Example 2.

EXAMPLE 3

The same graphite material as used in Example 1 was subjected to the high purification process and ultrahigh purification process mentioned above. Thereafter, the material was once taken out of the furnace and sealed in a polyethylene film bag, together with argon gas, and stored. The graphite material was taken out of the bag and again placed in the CVD furnace. Then, while maintaining the inside of the furnace at 10 Pa, the SiC coating process was carried out in the same manner as in Example 1. Argon gas, as a rare gas, was introduced into the furnace, followed by cooling to room temperature. After cooling to room temperature, the material, together with argon gas, was sealed in a polyethylene film bag and stored so that it might not be exposed to the atmosphere.

Thus, the obtained material was used as the sample of Example 3.

EXAMPLE 4

The same graphite material as used in Example 1 was subjected to the ultrahigh purification process alone, and sealed in a polyethylene film bag, together with argon gas, and stored. The graphite material was taken out of the bag and again placed in the CVD furnace. Then, while maintaining the inside of the furnace at the pressure of 10 Pa, the SiC coating process was carried out in the same manner as in Example 1. Argon gas, as a rare gas, was introduced into the furnace, followed by cooling to room temperature. After cooling to room temperature, the material, together with argon gas, was sealed in a polyethylene film bag and stored so that it might not be exposed to the atmosphere.

Thus the obtained material was used as the sample of Example 4.

EXAMPLE 5

The same graphite material as used in Example 1 was subjected to the high purification, ultrahigh purification, degassing (nitrogen elimination) and hydrogenation processes under the same conditions as in Example 1. Then, the graphite substrate material was coated with SiC using hydrogen with a purity of 99.9999% and $CH_3SiCl_3$ with a purity of 99.99% at 1300° C. for 2 hours. Argon gas, as a rare gas, was introduced into the furnace, followed by cooling to room temperature. The material, together with argon gas, was sealed in a polyethylene film bag and stored so that it might not be exposed to the atmosphere.

Thus, the obtained material was used as the sample of Example 5.

COMPARATIVE EXAMPLE 1

The same starting graphite material as used in Example 1, without subjecting to the high purification and ultrahigh purification processes, was subjected to the SiC coating process under the same conditions as in Example 1. The material was then cooled with argon gas to room temperature and sealed, together with argon gas, in a polyethylene film bag and stored.

Thus, the obtained material was used as the sample of Comparative Example 1.

COMPARATIVE EXAMPLE 2

The same starting graphite material as used in Example 1, without subjecting to the high purification and ultrahigh purification processes, was subjected to the degassing (nitrogen elimination), hydrogenation and SiC coating processes under the same conditions as in Example 1. The material was then cooled with argon gas to room temperature and sealed, together with argon gas, in a polyethylene film bag and stored.

Thus, the obtained material was used as the sample of Comparative Example 2.

COMPARATIVE EXAMPLE 3

The same starting graphite material as used in Example 1 was subjected to the high purification, ultrahigh purification, degassing (nitrogen elimination) and hydrogenation processes under the same conditions as in Example 1. The base graphite material was then coated with SiC using hydrogen with a purity of 99.9% and $CH_3SiCl_3$ with a purity of 99% at 1300° C. for 2 hours. Argon gas, as a rare gas, was introduced into the vessel, followed by cooling to room temperature. The material, together with argon gas, was sealed in a polyethylene film bag and stored.

Thus, the obtained material was used as the sample of Comparative Example 3.

COMPARATIVE EXAMPLE 4

The same starting graphite material as used in Example 1 was subjected to the high purification, ultrahigh purification, degassing (nitrogen elimination), hydrogenation and SiC coating processes under the same conditions as in Example 1. In the SiC coating process, however, the jig (SiC coated graphite) used in the furnace was prepared under the same conditions as in Comparative Example 2.

Thus, the obtained material was used as the sample of Comparative Example 4.

The impurity concentrations in the SiC coatings and graphite substrates of Examples 1 to 5 and Comparative Examples 1 to 4 were measured by the SIMS method described hereinabove. The impurity concentrations in the respective samples are summarized in Table 1.

TABLE 1

| | In SiC coatings | | In base graphite substrate | |
|---|---|---|---|---|
| | Nitrogen Content | Boron content | Nitrogen Content | Boron content |
| Example 1 | $4.6 \times 10^{16}$ | $8.7 \times 10^{14}$ | $5.0 \times 10^{16}$ | $1.5 \times 10^{15}$ |
| Example 2 | $5.1 \times 10^{16}$ | $4.8 \times 10^{15}$ | $1.1 \times 10^{18}$ | $1.9 \times 10^{16}$ |
| Example 3 | $9.8 \times 10^{16}$ | $1.9 \times 10^{16}$ | $4.0 \times 10^{17}$ | $1.5 \times 10^{16}$ |
| Example 4 | $2.4 \times 10^{17}$ | $1.1 \times 10^{16}$ | $6.5 \times 10^{17}$ | $2.0 \times 10^{16}$ |
| Example 5 | $4.3 \times 10^{16}$ | $2.3 \times 10^{16}$ | $5.0 \times 10^{16}$ | $1.5 \times 10^{15}$ |
| Comp. Ex. 1 | $8.4 \times 10^{18}$ | $8.2 \times 10^{16}$ | $1.3 \times 10^{16}$ | $3.7 \times 10^{17}$ |
| Comp. Ex. 2 | $5.2 \times 10^{17}$ | $4.8 \times 10^{16}$ | $6.6 \times 10^{16}$ | $1.9 \times 10^{17}$ |
| Comp. Ex. 3 | $4.9 \times 10^{17}$ | $3.5 \times 10^{17}$ | $5.0 \times 10^{16}$ | $1.5 \times 10^{15}$ |
| Comp. Ex. 4 | $5.3 \times 10^{16}$ | $2.2 \times 10^{16}$ | $5.0 \times 10^{16}$ | $1.5 \times 10^{15}$ |

(unit: atoms/cm$^3$)

The data in Table 1 indicate that when the graphite materials with low nitrogen concentration as used in Examples 1 to 5 are coated with SiC using raw materials with low impurity concentration, the nitrogen concentrations in the SiC coatings are low. It is also indicated that when the materials with low impurity concentration as used in Examples 1 to 5 are coated with SiC, the boron concentrations in the SiC coatings are low. When the graphite substrate materials with high nitrogen and boron concentrations as used in Comparative Examples 1 and 2 were coated with SiC, both nitrogen concentration and boron concentration in the SiC layers were high. In Comparative Examples 1 and 2, the colors of SiC coatings were abnormal, yellow. When the gases used in SiC coating were poor in purity or when the jigs in furnace inside parts used were made of a material with high impurity concentration, the nitrogen and boron concentrations became high.

Therefore, when the graphite materials low in nitrogen and boron concentrations as obtained in Example 1 to 5 are used as tools and furnace members for the production of SiC semiconductors, among others, the nitrogen and/or boron concentration in epitaxially grown layers of SiC semiconductors and the like can be reduced.

Then, SiC coated graphite susceptors for use in epitaxial growth of SiC were produced using the SiC coated carbonaceous material of Example 1 and the SiC coated carbonaceous material of Comparative Example 3. The impurity concentrations in the epitaxial SiC layers produced by using these susceptors were measured. The results, which are shown below in Table 2, indicate that the impurity concentrations in the epitaxial layers obtained by using the susceptors made of the carbonaceous material with low impurity concentrations as obtained in Example 1 are suppressed at low levels.

TABLE 2

| | In epitaxial SiC layer | |
|---|---|---|
| | Nitrogen concentration | Boron concentration |
| Example 1 | $2.6 \times 10^{15}$ | $6.4 \times 10^{13}$ |
| Comp. Ex. 3 | $5.1 \times 10^{16}$ | $4.8 \times 10^{15}$ |

(unit: atoms/cm$^3$)

Various alterations and modifications to the present invention can be made without departing the spirit or scope of the invention claimed in the appended claims and the above examples are by no means limitative of the scope of the invention.

What is claimed is:

1. SiC coated carbonaceous material, which comprises a carbonaceous material as substrate and SiC coating, having a boron content in said SiC layer of $2\times10^{16}$ atoms/$cm^3$ or lower as measured by SIMS.

2. SiC coated carbonaceous material as set forth in claim 1, wherein said carbonaceous material has a nitrogen content of $5\times10^{18}$ atoms/$cm^3$ or lower as measured by SIMS.

3. SiC coated carbonaceous material as set forth in claim 2, wherein said carbonaceous material has a boron content of $1\times10^{16}$ atoms/$cm^3$ or lower as measured by SIMS.

4. A jig or furnace member for producing semiconductors made of a material comprising the SiC coated carbonaceous material as set forth in claim 2.

5. A jig or furnace member for producing semiconductors made of a material comprising the SiC coated carbonaceous material as set forth in claim 3.

6. SiC coated carbonaceous material as set forth in claim 1, wherein said carbonaceous material has a boron content of $1\times10^{16}$ atoms/$cm^3$ or lower as measured by SIMS.

7. A jig or furnace member for producing semiconductors made of a material comprising the SiC coated carbonaceous material as set forth in claim 6.

8. A jig or furnace member for producing semiconductors made of a material comprising the SiC coated carbonaceous material as set forth in claim 1.

9. SiC coated carbonaceous material which comprises a carbonaceous material as substrate and SiC coating, having a nitrogen content in said SiC coating of $5\times10^{16}$ atoms/$cm^3$ or lower as measured by SIMS, wherein said carbonaceous material has a boron content of $1\times10^{16}$ atoms/$cm^3$ or lower as measured by SIMS.

10. A jig or furnace member for producing semiconductors made of a material comprising the SiC coated carbonaceous material as set forth in claim 9.

* * * * *